(12) United States Patent
Honda

(10) Patent No.: US 6,813,207 B2
(45) Date of Patent: Nov. 2, 2004

(54) SEMICONDUCTOR MEMORY DEVICE

(75) Inventor: Yasuhiko Honda, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/337,375

(22) Filed: Jan. 7, 2003

(65) Prior Publication Data

US 2003/0133346 A1 Jul. 17, 2003

(30) Foreign Application Priority Data

Jan. 11, 2002 (JP) .......................................... 2002-4146

(51) Int. Cl.[7] .............................................. G11C 7/00
(52) U.S. Cl. .................. 365/205; 365/207; 365/230.03
(58) Field of Search ................................ 365/205, 207, 365/230.03

(56) References Cited

U.S. PATENT DOCUMENTS

| | | | | |
|---|---|---|---|---|
| 5,481,500 A | * | 1/1996 | Reohr et al. ................. | 365/205 |
| 6,061,297 A | * | 5/2000 | Suzuki ........................ | 365/207 |
| 6,243,312 B1 | * | 6/2001 | Kim ............................ | 365/205 |
| 6,337,810 B1 | * | 1/2002 | Yamasaki et al. ......... | 365/189.05 |
| 2002/0186593 A1 | * | 12/2002 | Takano et al. ......... | 365/185.21 |

FOREIGN PATENT DOCUMENTS

| | | |
|---|---|---|
| JP | 62-150590 | 7/1987 |
| JP | 01-165091 | 6/1989 |
| JP | 02-185794 | 7/1990 |
| JP | 03-054795 | 3/1991 |
| JP | 06-325578 | 11/1994 |

* cited by examiner

*Primary Examiner*—Huan Hoang
(74) *Attorney, Agent, or Firm*—Oblon, Spivak, McClelland, Maier & Neustadt, P.C.

(57) ABSTRACT

A semiconductor memory device comprises a plurality of sense amplifiers divided into a plurality of groups, each of the groups being a unit of a page readout operation; a sense amplifier control signal generation circuit which outputs a sense amplifier control signal for enabling the sense amplifiers of each group and disabling the sense amplifiers of each group, wherein the sense amplifier control signal enables and disables the sense amplifiers of a part of the groups at different timing from the sense amplifiers of other groups; and a plurality of memory cells connected to the sense amplifiers via data lines.

8 Claims, 13 Drawing Sheets

$\Delta tSAEN=tP/n$

PAGE READOUT MODE

SEMICONDUCTOR MEMORY DEVICE

CROSS REFERENCE TO RELATED APPLICATION

This application claims benefit of priority under 35 U.S.C. §119 to Japanese Patent Application No. 2002-4146, filed on Jan. 11, 2002, the entire contents of which are incorporated by reference herein.

BACKGROUND OF THE INVENTION

1. Field of the Invention

The present invention relates to fast page readout used in a semiconductor memory device and, more particularly, to the semiconductor memory device performing division readout.

2. Description of the Related Art

In a conventional semiconductor memory device such as a flash memory, page readout has been used to read out and latch data of a few words in a lump by sense amplifiers and to fast output the data having a desired address only by the control at an output side. Specifically, during a first access, namely, an initial access, for example, plural data is latched in a lump. Then, the latched data is fast outputted by switching at the output side. In the conventional semiconductor memory device, the data of a few words, for example, data of 8 words (16 I/Os per word) has been simultaneously read out by the sense amplifiers of 8×16=128 in number.

The page readout does not increase current consumed by cell decode even the number of data increases. Specifically, although additional current is required to open a plurality of bit lines, there is no increase in current by the amounts of word line and predecode, so that the entire consumption current is not greatly affected. Compared to this, current consumed by the sense amplifier increases in proportion to the number of data. This is because each bit line is connected to each sense amplifier. As a result, when loads of all the sense amplifiers charge the data lines at a time, the consumption current momentarily increases to cause voltage drop and power noise. FIG. 8 shows a diagrammatic block diagram of the conventional semiconductor memory device. A plurality of memory cells 30 are respectively grouped by a unit of the plural number thereof. A plurality of data lines 31 are connected to each of the memory cells 30. These data lines 31 are grouped and connected to a plurality of grouped sense amplifiers 32. The number of the sense amplifiers 32 prepared in each group is, for example, 16. The 16 sense amplifiers in number correspond to 16 I/Os in number per word. In the structure shown in FIG. 8, 8 groups of the sense amplifiers 32, namely, 128 in number being a product of 16 and 8, are provided. The sense amplifiers 32 are provided inside a peripheral circuit area of the semiconductor memory device that differs from its memory cell area. Here, the sense amplifiers to be divided can be set by a proper unit such as 1 word, 2 words, and the like. Here, it is set to be every 8 words.

A sense amplifier enable signal with the same timing is inputted in each sense amplifier 32. This sense amplifier enable signal is outputted from a single sense amplifier enable signal generation circuit 33.

Next, operation of the conventional semiconductor memory device shown in FIG. 8 will be explained referring to FIG. 9 that shows timing of signals inputted and outputted to each structure in FIG. 8. An address signal is inputted to designate a memory cell to be accessed, and thereafter the sense amplifier enable signals to be inputted into each sense amplifier 32 arise simultaneously from LOW level to HIGH level so that all the sense amplifiers 32 are activated. Concurrently with the activation of the sense amplifiers 32, initial current is consumed in each sense amplifier 32. When the sense amplifiers 32 are activated, memory cells 30 that are connected to the sense amplifiers 32 are accessed. In this manner, the sense amplifiers are activated and data read out from the memory cells is outputted from I/Os (not shown).

The consumption current shown at the very bottom section in FIG. 9 momentarily and drastically increases just after all the sense amplifiers are activated, then becomes a constant state, and recovers to an initial value after the readout completes. Specifically, since maximum instantaneous consumption current is the sum of the initial consumption current in each activated sense amplifier and the time for each sense amplifier to start its activation is identical, the instantaneous consumption current extremely increases.

In addition, data amount (the number of words) to be read out tends to increase in the future due to further fast access. In this page readout, read operation is performed by the number of sense amplifiers that correspond to the data amount (the number of words) to be simultaneously read out, so that the more the data amount increases, the more the consumption current in that instant increases.

The following problems arise in the above-described conventional semiconductor memory device.

When power supply ability at a system side using the semiconductor memory device is poor, power voltage drop occurs in this instant and power noise occurs due to drastic current consumption, which may cause to lower readout ability of the semiconductor memory device and may cause its malfunction as well as malfunction in other devices mounted on the system. In a flash memory, when power drop of the system occurs, writing and erasing operation may run down. Particularly in a mobile electronic device and the like, the use of a battery tends to lower power supply ability for a semiconductor memory device built in the mobile electronic device, so that an increase in the instantaneous consumption current has a great impact thereon. In addition, concurrently with a technology trend of fast data readout, when data length increases, for example, from 16 to 32 in number, the consumption current increases.

In the conventional art, in a case of 8 words, the instantaneous consumption current flows, for example, by a several 100 mA. When its wiring resistance is assumed to be 1 ohm, voltage drop around the circuit becomes −0, several V and characteristic deterioration occurs.

SUMMARY OF THE INVENTION

In order to accomplish the aforementioned and other objects, according to one aspect of the present invention, a semiconductor memory device, comprises;

a plurality of sense amplifiers divided into a plurality of groups, each of the groups being a unit of a page readout operation;

a sense amplifier control signal generation circuit which outputs a sense amplifier control signal for enabling the sense amplifiers of each group and disabling the sense amplifiers of each group, wherein the sense amplifier control signal enables and disables the sense amplifiers of a part of the groups at different timing from the sense amplifiers of other groups; and a plurality of memory cells connected to the sense amplifiers via data lines.

DETAILED DESCRIPTION OF THE INVENTION

[First Embodiment]

Figure 1:
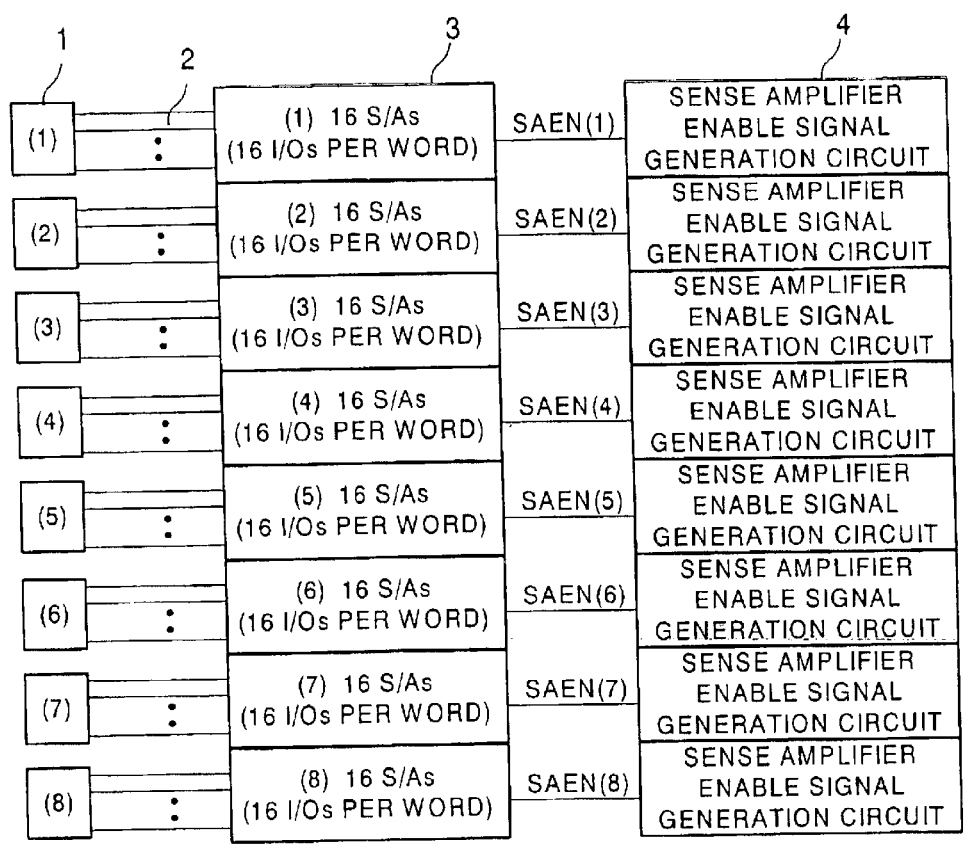
FIG. 1 is a diagrammatic block diagram of a semiconductor memory device according to a first embodiment.

A structure of a semiconductor memory device of the present embodiment is explained referring to a structural block diagram shown in FIG. 1. A plurality of memory cells 1 are respectively grouped by a unit of the plural number thereof. A plurality of data lines 2 are connected to each of the memory cells 1. These data lines 2 are grouped and connected to a plurality of grouped sense amplifiers 3. The number of the sense amplifiers 3 prepared in each group is, for example, 16. The 16 sense amplifiers in number correspond to 16 I/Os in number per word. In the structure shown in FIG. 1, 8 groups of the sense amplifiers 3, namely, 128 in number being a product of 16 and 8, are provided. The sense amplifiers 3 are provided inside a peripheral circuit area of the semiconductor memory device that differs from its memory cell area. Here, the sense amplifiers to be divided can be set by a proper unit such as 1 word, 2 words, and the like. It is set to be every 8 words in this embodiment.

In each sense amplifier 3, a sense amplifier enable (sense amplifier activation) signal is inputted into each group of the sense amplifiers. The sense amplifier enable signal of the same timing is inputted into each sense amplifier 3 in the same group, while the sense amplifier enable signal of different timing is inputted into the sense amplifier of a different group. In the example of FIG. 1, eight sense amplifier enable signals SAEN(1) to SAEN(8) are inputted into eight groups (1) to (8), respectively.

The plural kinds of the sense amplifier enable signals are outputted respectively from separate sense amplifier enable signal generation circuits 4. Specifically, a plurality of the sense amplifier enable signal generation circuits 4 output the sense amplifier enable signals SAEN(1) to SAEN(8) that have different timing waves with respect to each signal group that outputs to the sense amplifier 3 to which each thereof is connected. The sense amplifier enable signals SAEN(1) to SAEN(8) cause to start the readout with respect to each 1 word considering the sense amplifier as a unit group.

Next, operation of the semiconductor memory device shown in FIG. 1 will be explained referring to FIG. 2 that shows timing of signals inputted and outputted to each structure in FIG. 1. An address signal ADDRESS is inputted to designate a memory cell to be accessed, a desired memory cell is selected, and thereafter the sense amplifier enable signal SAEN(1) arises from LOW level to HIGH level so that the sense amplifier 3 of the group (1) is activated. Concurrently with this activation of the sense amplifier 3 of the group (1), initial current is consumed in the sense amplifier 3 in the group (1). When the sense amplifier 3 in the group (1) is activated, data in the memory cell (1) that is connected to this sense amplifier 3 in the group (1) is read out.

Next, a sense amplifier enable signal SAEN(2) arises from LOW level to HIGH level so that the sense amplifier 3 in the group (2) is activated. Concurrently with this activation of the sense amplifier 3 in the group (2), initial current is consumed in the sense amplifier 3 in the group (2). When the sense amplifier 3 in the group (2) is activated, data in the memory cell (2) that is connected to this sense amplifier 3 in the group (2) is read out. As such, each of the sense amplifier enable signals arises in turn from LOW level to HIGH level so that the sense amplifiers are sequentially activated. In the middle of the sense amplifier activation, the data read out from the memory cell is sequentially outputted from I/Os (not shown).

Figure 2:
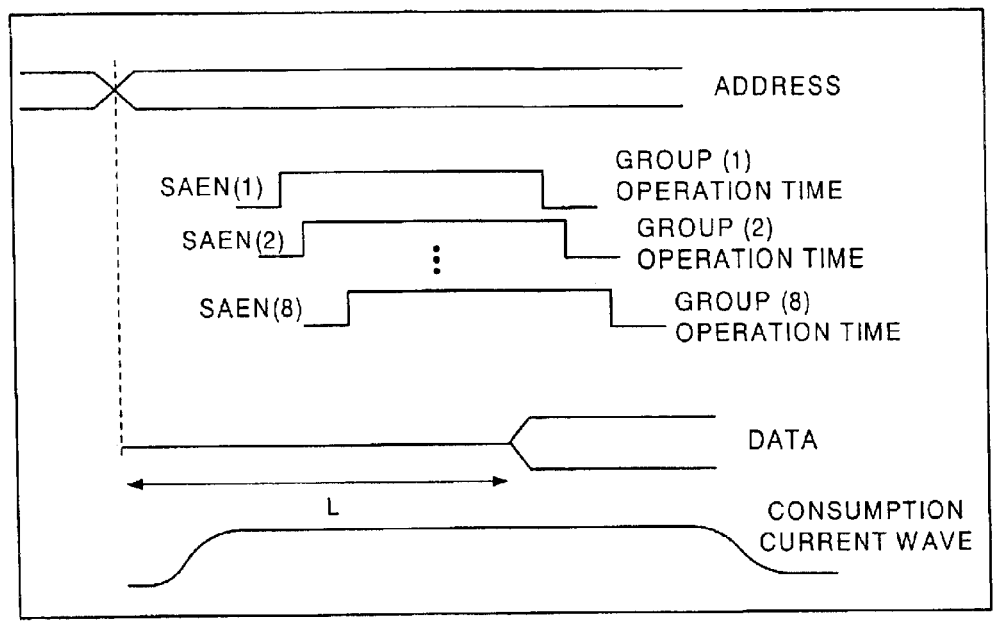
FIG. 2 is a timing chart showing page readout operation of the semiconductor memory device according to the first embodiment.

The consumption current shown at the very bottom section in FIG. 2 keeps a substantially averaged value after the address is inputted, and then recovers to an initial value after all the activation of the sense amplifiers are completed. This indicates that it becomes possible to smooth instantaneous consumption current by providing the sense amplifier enable signal that controls the read operation, charging the data line, reading out the data, and providing timing for each signal while maintaining a period until latching the data constant, with respect to each 1 word of the sense amplifier. Specifically, since the instantaneous consumption current is the sum of the consumption current in each activated sense amplifier and the time for each sense amplifier to start its activation is shifted, the instantaneous consumption current becomes smoothed. Accordingly, the read operation is to first detect address during a decoding period and thereafter to start charging. Then, the memory cells are sequentially accessed and amplification takes place to cause output from the sense amplifier, and thereafter, latch operation takes place.

Operation timing of the sense amplifier enable signals SAENi (i is a group specific number of the sense amplifier designated by the inputted address signal) are generated by an internal clock signal. The sense amplifier enable signal SAENi is shifted about a few nanoseconds at a peak, while being shifted, for example, about 5 nanoseconds at a first access. Then, all the sense amplifier enable signals SAENi are activated within a period L that is a period before the firstly-accessed data in the memory cell (first access data) is outputted, and then all the data are latched. The timing in which the peak shifts of the sense amplifier enable signals SAENi is changed depending on the number of the sense amplifiers to be divided. Specifically, in a case of the greater number of divisions, the timing to shift becomes smaller, and in a case of the less number of divisions, the timing to shift becomes greater.

The read operation has such 3 operation timing as data line charging, sensing, and latching, wherein these 3 timing is made to exist independently and its execution is performed by a sense amplifier control circuit. Specifically, the sense amplifier control circuit executes such operation that the sense amplifier load charges the data line, determines the data, and holds time to optimize the data.

Next, FIG. 3 shows a circuit diagram of portions of the sense amplifier 3 and the memory cell 1 shown in FIG. 1. In the sense amplifier 3, a data line connection switch 6 is connected to a memory cell transistor 5 in the memory cell 1 via a data line 2. A reference data line connection switch 9 is connected to a reference memory cell transistor 7 via a reference data line 8. A first load 10 is connected to this data line connection switch 6 via a bias transistor B1, while a second load 11 is connected to the reference data line connection switch 9 via a bias transistor B2. A cell-drain voltage BIAS, which is a bias voltage, is applied to gate terminals of the bias transistors B1 and B2. Moreover, a current mirror portion 12 is connected between the bias transistor B1 and the bias transistor B2. A common sense amplifier enable signal SAEN is inputted into the current mirror portion 12, the first load 10 and the second load 11. Furthermore, a data determination portion 24 and a data latch portion 13 are connected to the current mirror portion 12. Data in the semiconductor memory device is outputted from the data latch portion 13 via the I/O portion. Here, the data latch portion 13 comprises, for example, two inverters.

The first load 10 is a circuit for supplying a current to the data line 2, and the first load 10 has p-type MOS transistors 50 and 52 and an inverter 54. Therefore, when the sense amplifier enable signal SAEN of HIGH level is inputted into the inverter 54, the current is supplied to the data line 2 from a voltage source VDD. On the other hand, the second load 11 is a circuit for supplying a current to the reference data line 8, and the second load 11 has p-type MOS transistors 60 and 62 and an inverter 64. Therefore, when the sense amplifier enable signal SAEN of HIGH level is inputted into the inverter 64, the current is supplied to the data reference line 8 from the voltage source VDD.

The current mirror portion 12 is a circuit for comparing a voltage of a node N1 with a voltage of a node N2 in order to read out data of the memory cell transistor 5. That is, "0" data or "1" data is stored in the memory cell transistor 5, so that a threshold voltage of the memory cell transistor 5 is set at a threshold voltage of the "0" data or the "0" data. A threshold voltage of the reference memory cell transistor 7 is set at an intermediate level between "1" data and "1" data.

The current mirror portion 12 has an inverter 70, p-type MOS transistors 72, 74 and 76, and N-type MOS transistors 78 and 80. Therefore, when the sense amplifier enable signal SAEN of HIGH level is inputted into the inverter 70, the current mirror portion 12 is activated and then a voltage of a node N3 is inputted into the data determination portion 24. The data determination portion 24 determines the voltage of the node N3 and then the data latch portion 13 latches the data determined by the data determination portion 24.

Figure 3A:
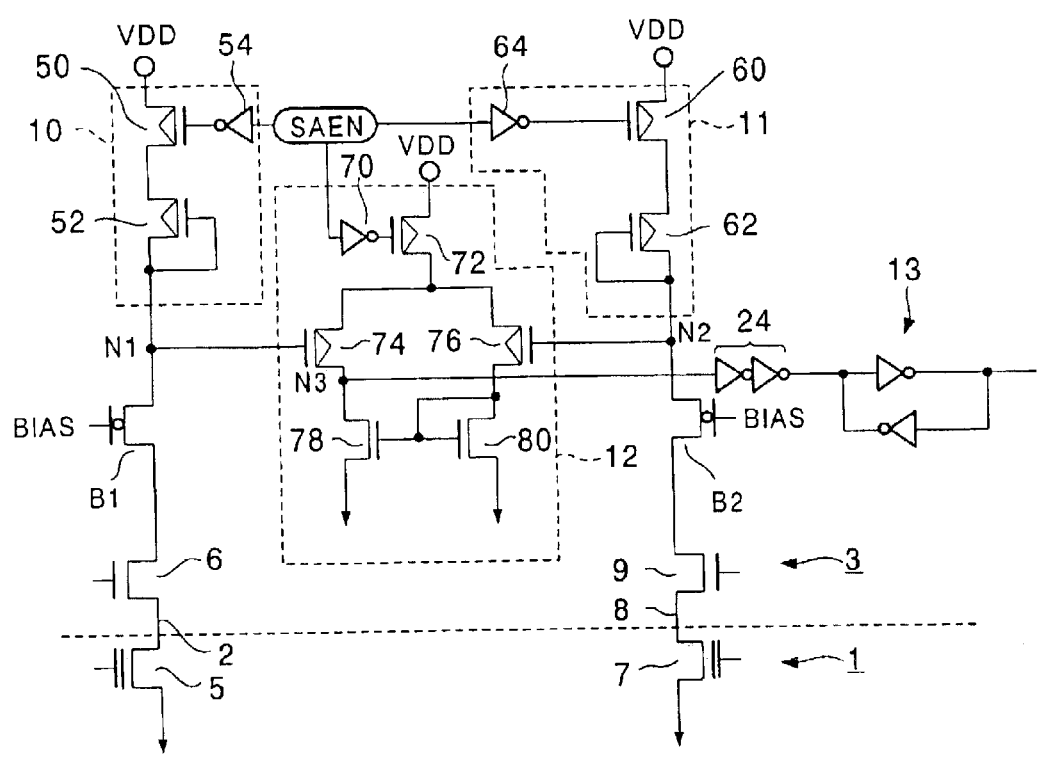
FIG. 3A is a circuit diagram showing a sense amplifier and a memory cell of the semiconductor memory device according to the first embodiment.
Figure 3B:
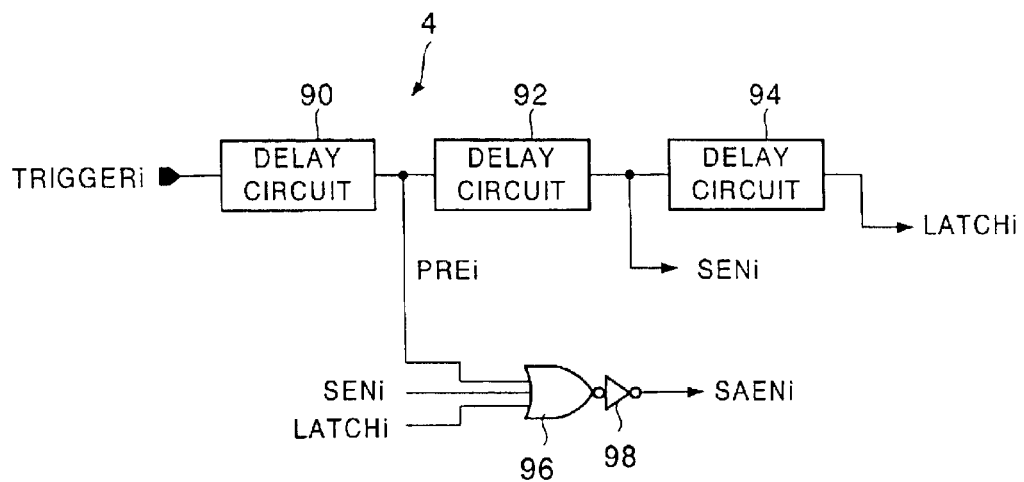
FIG. 3B is a circuit diagram showing an example of a sense amplifier enable signal generation circuit according to the first embodiment.
Figure 3C:
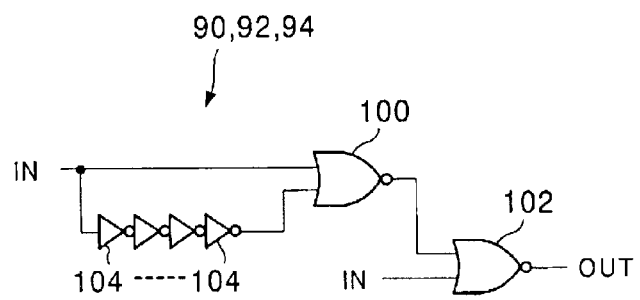
FIG. 3C is a circuit diagram showing an example of a delay circuit in the sense amplifier enable signal generation circuit in FIG. 3B.
Figure 3D:
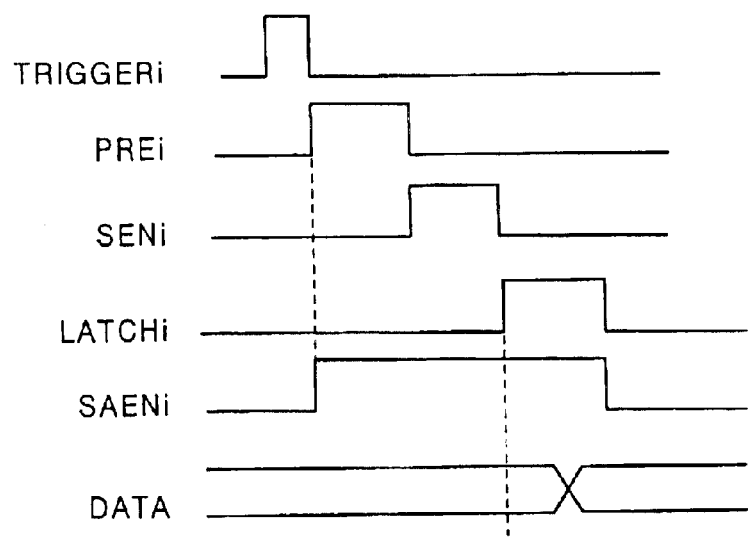
FIG. 3D is a diagram showing operation waveforms at various points of the sense amplifier enable signal generation circuit in FIG. 3B.

FIG. 3B is a circuit diagram showing an example of the sense amplifier enable signal generation circuit 4 according to the embodiment, FIG. 3C is a circuit diagram showing an example of any one of delay circuits 90, 92 and 94 in the sense amplifier enable signal generation circuit 4, and FIG. 3D is a diagram showing operation waveforms at various points in the sense amplifier enable signal generation circuit 4.

As shown in FIG. 3B and FIG. 3D, the sense amplifier enable signal generation circuit 4 according to the embodiment has three delay circuits 90, 92 and 94, a NOR circuit 96 and an inverter 98. A trigger pulse signal TRIGGER1 is inputted into the delay circuit 90 at an optional timing. Specifically, as shown in FIG. 2, the trigger pulse signals TRIGGER1 are inputted at different timing for every sense amplifier enable signal generation circuits 4.

The delay circuits 90, 92 and 94 are circuits for delaying an inputted pulse and adjusting a pulse width thereof. Therefore, a data line precharge pulse signal PREi is outputted from the delay circuit 90 after a predetermined period delay from the input of the trigger pulse signal TRIGGERi. Specifically, the data line precharge pulse signal PREi goes to HIGH level when the trigger pulse signal TRIGGER1 goes to LOW level, and then the data line precharge pulse signal PREi goes to LOW level after a predetermined period delay. While the data line precharge pulse signal PREi is LIGH level, a precharge operation of the data line 2 is performed.

The data line precharge pulse signal PREi is inputted into the delay circuit 92. A sense pulse signal SENi is outputted from the delay circuit 92 after a predetermined period delay from the input of the data line precharge pulse signal PREi. Specifically, the sense pulse signal SENi goes to HIGH level when the data line precharge pulse signal PREi goes to LOW level, and then the sense pulse signal SENi goes to LOW level after a predetermined period delay. While the sense pulse signal SENi is LIGH level, data of the memory cell is read out via the data line 2, and then the data is determined in the data determination portion 24.

The sense pulse signal SENi is inputted into the delay circuit 94. A data latch pulse signal LATCHi is outputted from the delay circuit 94 after a predetermined period delay from the input of the sense pulse signal SENi. Specifically, the data latch pulse signal LATCHi goes to HIGH level when the sense pulse signal SENi goes to LOW level, and then the data latch pulse signal LATCHi goes to LOW level after a predetermined period delay. While the data latch pulse signal LATCHi is LIGH level, a data latch operation is performed in the data latch portion 13.

The data line precharge pulse signal PREi, the sense pulse signal SENi and the data latch pulse signal LATCHi are inputted into the NOR circuit 96. Therefore, the sense amplifier enable signal SAENi of HIGH levle is outputted from the inverter 98 via the NOR circuit 96, and a period of the sense amplifier enable signal SAENi of HIGH level equals putting periods of these three signals of HIGH level together. As a result, the sense amplifier enable signal SAENi can be in an enable state during a necessary time for precharging the data line 2 connected to the memory cell 3, determining data read out from the memory cell 3 via the date line 2 and latching the data.

As shown in FIG. 3C, the delay circuit 90 has NOR circuits 100 and 102 and inverters 104 of an even number (the delay circuits 92 and 94 have the same structure). In the delay circuit 90, the trigger pulse signal TRIGGER1, which is an input signal IN, is inputted, and the data line precharging pulse signal PREi, which is an output signal OUT, is outputted. The number of the inverters 104 is changed in order to adjust the pulse width of the output signal OUT.

The semiconductor memory device is so configured as to have such a function that the respective sense amplifier enable signals SAENi independently take timing to become enable in turn, while the load in the sense amplifier charging the data line, determining the data, and holding time optimized to latch the data. This results in reducing the consumption current. This allows to prevent maximum consumption current from temporarily flowing at the moment of the sense amplifier activation, as well as to render the consumption current averaged in a period of the sense amplifier activation and to reduce the maximum consumption current.

In a conventional art, voltage drop around the sense amplifier circuit becomes –0, several V in a case of 8 words, which causes characteristic deterioration, but in the semiconductor memory device in this embodiment, the voltage drop occurs only by 1 word, its voltage drop being a part of the number of divisions in the conventional art, for example, –0.0 several V of an eighth part.

In the present embodiment, such a semiconductor memory device can be provided that, when a plurality of the sense amplifiers start the read operation to charge the data line, read operation starting timing and read operation period are provided with respect to, for example, each unit word, to smooth the instantaneous consumption current and to reduce the voltage drop and power noise occurred in a case of a greater maximum consumption current.

The present embodiment presents a semiconductor memory device in which operation regarding division readout is changed and no changes are added to the other operation in the conventional semiconductor memory device.

The present embodiment relates to page readout that reads out a few words of data in a lump, wherein setting readout timing with respect to each word enables to provide such a semiconductor memory device that can suppress the consumption current at the peak of the page readout, as well as reduce the voltage drop and the power noise, and can prevent deterioration in readout ability and malfunction in readout.

[Second Embodiment]

Figure 4:
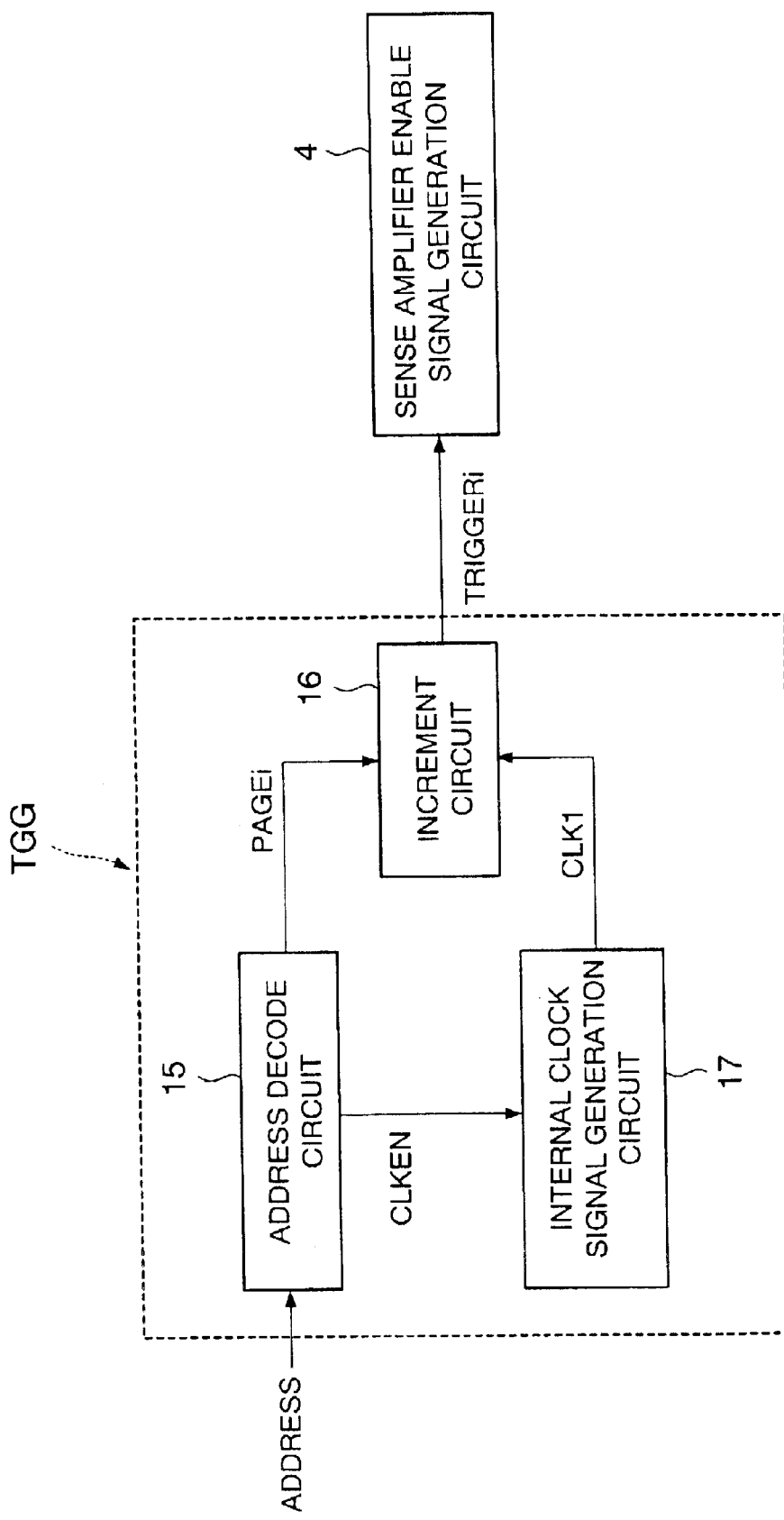
FIG. 4 is a block diagram of an example of a sense amplifier enable signal generation circuit and a trigger signal generation circuit of a semiconductor memory device according to a second embodiment.
Figure 5:
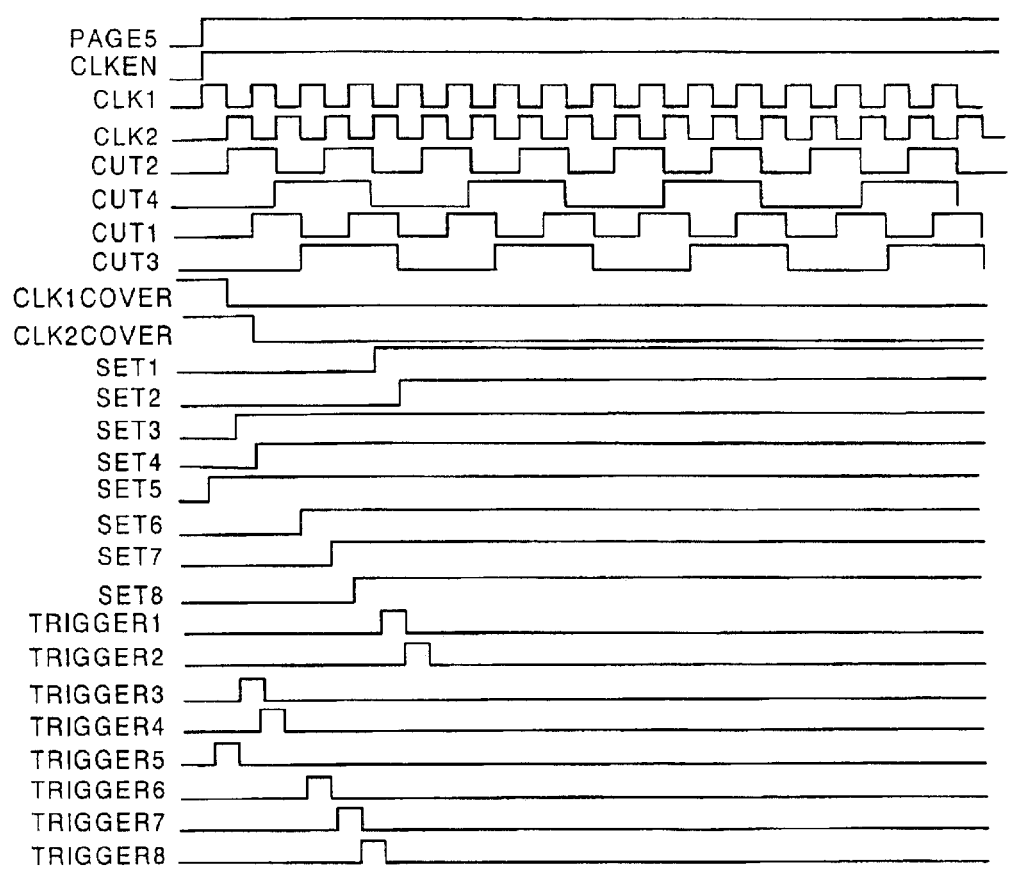
FIG. 5 is a timing chart showing page readout operation of the semiconductor memory device according to the second embodiment.

In the present embodiment, with respect to the semiconductor memory device in the first embodiment shown in FIG. 1, it has a trigger signal generation circuit TGG as shown in FIG. 4 but other structures are the same as those in the first embodiment. In addition, FIG. 5 is a diagram showing operation waveforms at various points in the trigger signal generation circuit TGG in FIG. 4.

Here, the trigger signal generation circuit TGG includes an address decode circuit 15 into which an address signal ADDRESS is inputted, an internal clock signal generation circuit 17 into which a clock enable signal CLKEN is inputted from the address decode circuit 15, and an increment circuit 16 into which an page selection signal PAGEi from the address decode circuit 15 and an internal clock signal CLK1 from the internal clock signal generation circuit 17 are inputted.

The address decode circuit 15 decodes the address signal ADDRESS so as to generate the page selection signal PAGEi so that the sense amplifier enable signal SAENi corresponding to the inputted address signal ADDRESS firstly reaches an activated state (i is a group-specific number of the sense amplifier designated by the inputted address signal). In this manner, having the address decode circuit 15 allows to make a first access maximally fast. In order not to delay the first access, the sense amplifier to be firstly enabled is decoded. In an example of FIG. 5, a PAGE5 of a fifth page is selected, and therefore the page selection signal PAGE5 goes to HIGH level firstly.

In addition, the address decode circuit 15 outputs the clock enable signal CLKEN which enables the internal clock signal generation circuit 17 to output the internal clock signal CLK1. The internal clock signal generation circuit 17 outputs the internal clock signal CLK1 to the increment circuit 16 in accordance with the clock enable signal CLKEN.

After the increment circuit 16 sets the sense amplifier enable signal, which should be firstly enabled, in the enable state, the increment circuit 16 sequentially sets the remaining sense amplifier enable signals in the enable states. Therefore, in the example of FIG. 5, after the increment circuit 16 outputs the trigger pulse signal TRIGGER5 of the group 5 of sense amplifiers which should be firstly enabled, the increment circuit 16 sequentially outputs the trigger pulse signals TRIGGER3, TRIGGER4, TRIGGER6, TRIGGER7, TRIGGER8, TRIGGER1 and TRIGGER2 of the groups 3, 4, 6, 7, 8, 1 and 2.

Figure 6:
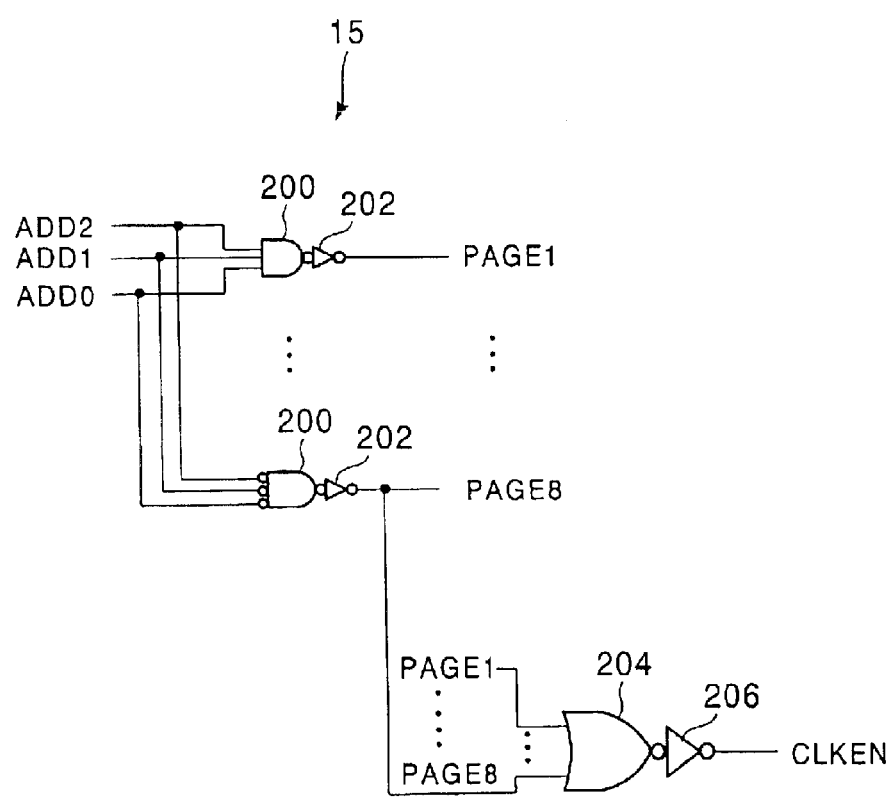
FIG. 6 is a circuit diagram of an example of an address decode circuit of the trigger signal generation circuit according to the second embodiment.

FIG. 6 is a circuit diagram showing an example of the address decode circuit 15 according to the embodiment. As shown in FIG. 6, the address decode circuit 15 according to the embodiment includes eight NAND circuits 200, eight inverters 202, a NOR circuit 204 and an inverter 206.

In this embodiment, sense amplifiers 3 are divided into eight pages (eight groups) and therefore the address signal ADDRESS is composed of three bits. As a result, the address decode circuit 15 includes eight decoders each having the NAND circuit 200 and the inverter 202. These inverters 202 output the page selection signals PAGE1 to PAGE8. That is, one of the page selection signals PAGE1 to PAGE8 goes to HIGH level. These page selection signals PAGE1 to PAGE8 are inputted into the NOR circuit 204. Therefore, when any one of the page selection signals PAGE1 to PAGE8 goes to HIGH level, an output of the inverter 206 goes to HIGH level and then the clock enable signal CLKEN of HIGH level is outputted.

Figure 7A:
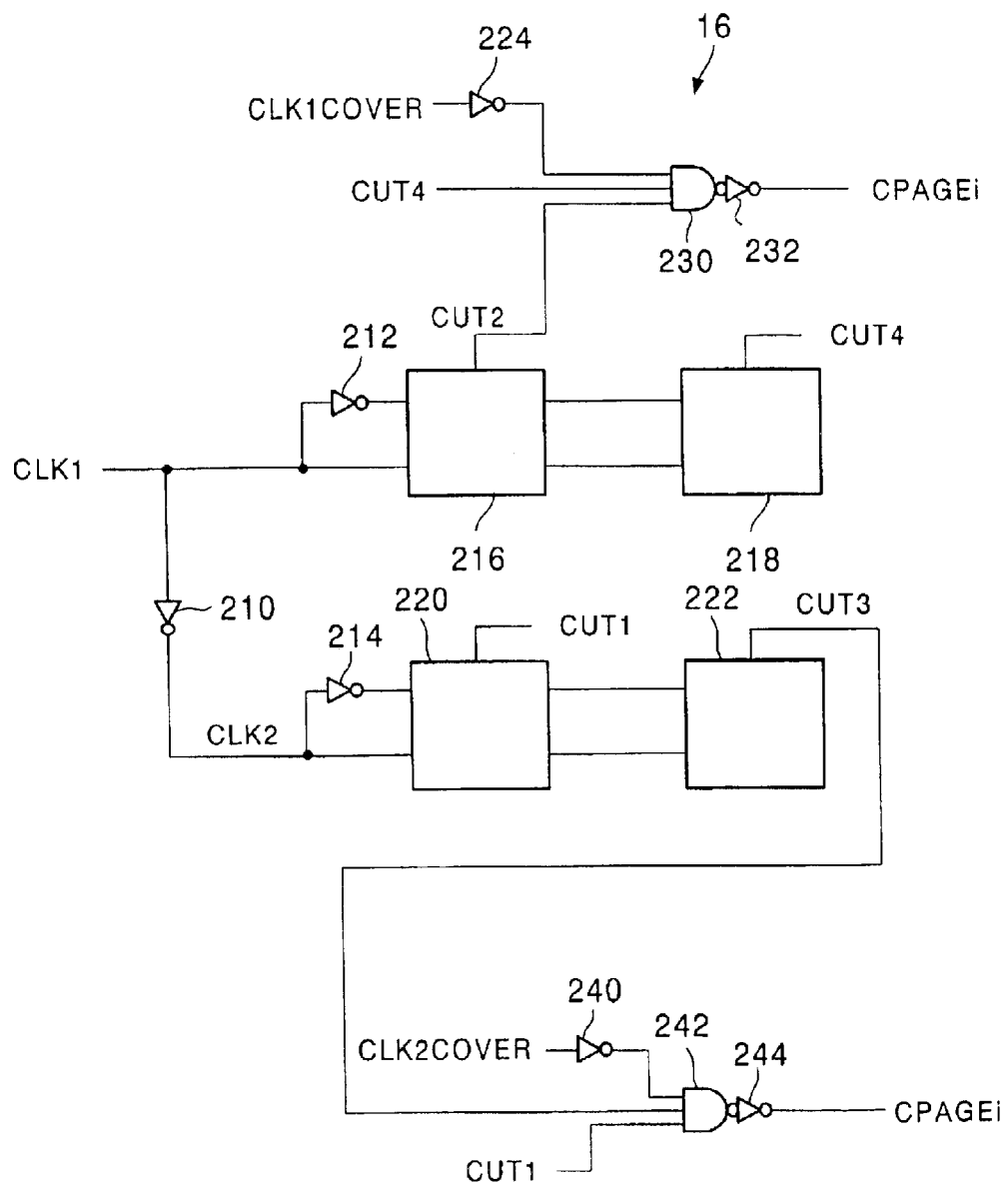
FIG. 7A is a circuit diagram of an example of an increment circuit of the trigger signal generation circuit according to the second embodiment.
Figure 7B:
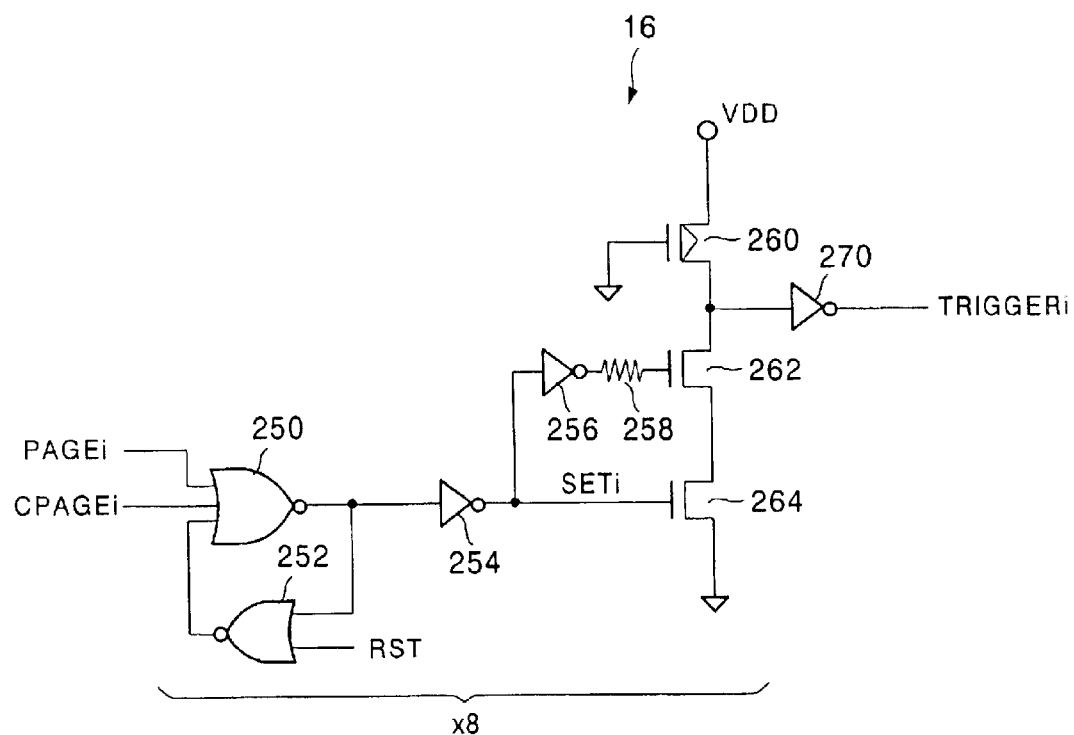
FIG. 7B is the circuit diagram of an example of an increment circuit of the trigger signal generation circuit according to the second embodiment.
Figure 8:
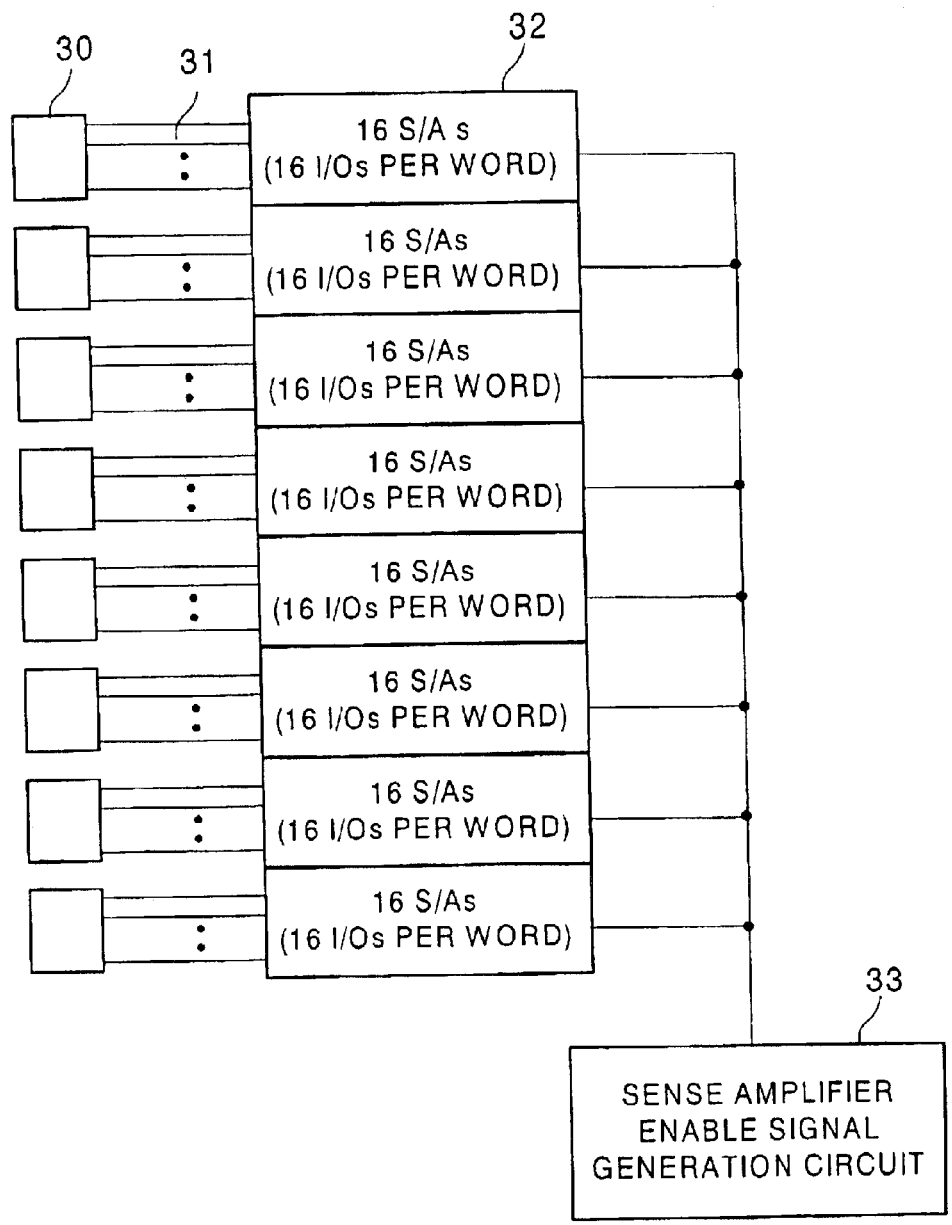
FIG. 8 is a diagrammatic block diagram of a conventional semiconductor memory device.
Figure 9:
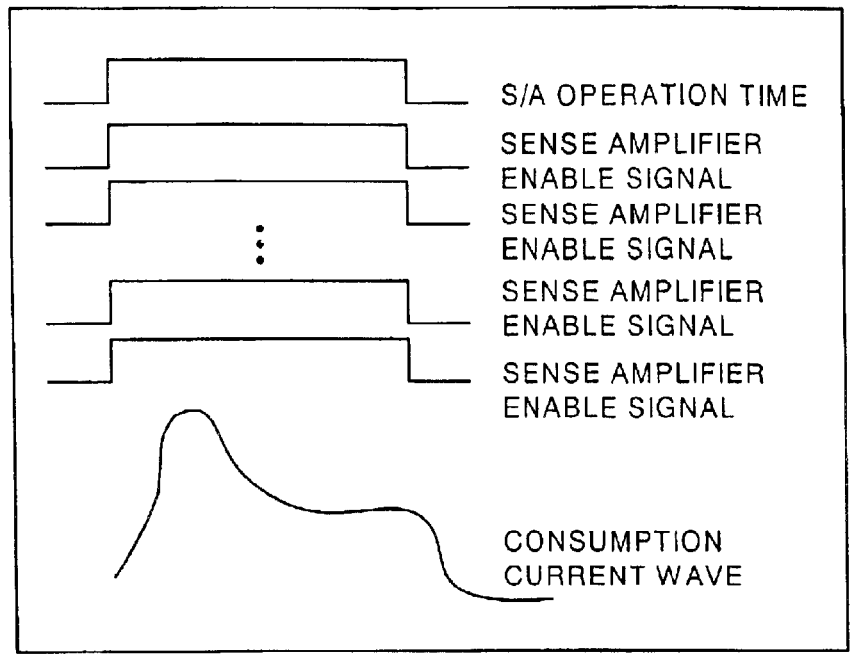
FIG. 9 is a timing chart showing page readout operation of the conventional semiconductor memory device.

FIG. 7A and FIG. 7B are circuit diagrams showing an example of the increment circuit 16 according to the embodiment. As shown in FIG. 7A, the increment circuit 16 according to the embodiment inverters 210, 212 and 214, binary counters 216, 218, 220 and 222, an inverter 224, a NAND circuit 230, an inverter 232, an inverter 240, a NAND circuit 242 and an inverter 244. Furthermore, as shown in FIG. 7B, the increment circuit 16 further includes NOR circuits 250 and 252, inverters 254 and 256, a resistor 258, a P-type MOS transistor 260, an N-type MOS transistor 262 and an inverter 270. Eight sets of these elements in FIG. 7B are provided. That is, one set of the circuit in FIG. 7B is provided for one page.

As shown in FIG. 7A, the internal clock signal CLK1 from the internal clock signal generation circuit 17 is inputted into the binary counter 216. The internal clock signal CLK1 is inverted at the inverter 210 to generate an internal clock signal CLK2 and it is inputted into the binary counter 220. That is, the internal clock signal CLK1 and the internal clock signal CLK2 are displaced a half period with respect to each other, as shown in FIG. 5.

The binary counters 216, 218, 220 and 222 are circuits for performing one count up operation per two clock periods. As a result, a clock period of the internal clock signal CUT2 which is an output of the binary counter 216 is twice as long as that of the internal clock signal CLK1, and a clock period of the internal clock signal CUT4 which is an output of the binary counter 218 is twice as long as that of the internal clock signal CUT2. Likewise, a clock period of the internal clock signal CUT1 which is an output of the binary counter 220 is twice as long as that of the internal clock signal CLK2, and a clock period of the internal clock signal CUT3 which is an output of the binary counter 222 is twice as long as that of the internal clock signal CUT1.

The internal clock signals CUT2 and CUT4 are inputted into the NAND circuit 230. A clock cover signal CLK1COVER of LOW level is inverted at the inverter 224 and the inverted clock cover signal CLK1COVER is also inputted into the NAND circuit 230. Therefore, the inverter 232 outputs a page selection signal CPAGEi for sequentially enabling the sense amplifiers 3 of the pages 1, 3, 5 and 7.

Likewise, the internal clock signals CUT1 and CUT3 are inputted into the NAND circuit 242. A clock cover signal CLK2 COVER of LOW level is inverted at the inverter 240 and the inverted clock cover signal CLK2 COVER is also inputted into the NAND circuit 242. Therefore, the inverter 244 outputs a page selection signal CPAGEi for sequentially enabling the sense amplifiers 3 of the pages 2, 4, 6 and 8.

The page selection signal PAGEi and the page selection signal CPAGEi are inputted into one of the NOR circuits 250 which is provided for a corresponding page. For example, the page selection signal PAGE1 and the page selection signal CPAGE1 are inputted into the NOR circuit 250 of the page 1.

An output of the NOR circuit 250 goes to LOW level when the page selection signal PAGEi or the page selection signal CPAGEi goes to HIGH level, and then the inverter 270 outputs one pulse of the trigger pulse signal TRIGGER1. For example, as shown in FIG. 5, when the page selection signal PAGE5 goes to HIGH level, one pulse of the trigger pulse signal TRIGGER5 is outputted. After this, one pulses of the trigger pulse signals TRIGGER3, TRIGGER4, TRIGGER6, TRIGGER7, TRIGGER8, TRIGGER1 and TRIGGER2 are sequentially outputted. In the example in FIG. 7B, a pulse generation circuit is composed of the inverters 254, 256 and 270, the resistor 258 and the MOS transistors 260, 262 and 264.

Before the readout operation, a reset signal RST is inputted into all of the eight NOR circuits 252, so that this increment circuit is reset.

The present embodiment can obtain the same effect as in the first embodiment. Further in the present embodiment, since it is not identified which address can be designated as an initial address, a designated address is read out for the initial address, and then addresses can be sequentially incremented to be read out. Note that the above respective embodiments can be performed in combination.

[Third Embodiment]

In a third embodiment, a shift time ΔtSAEN among the sense amplifier enable signals SAENi in a page readout mode and a burst readout mode in the above-mentioned embodiments will be discussed.

Figure 10:
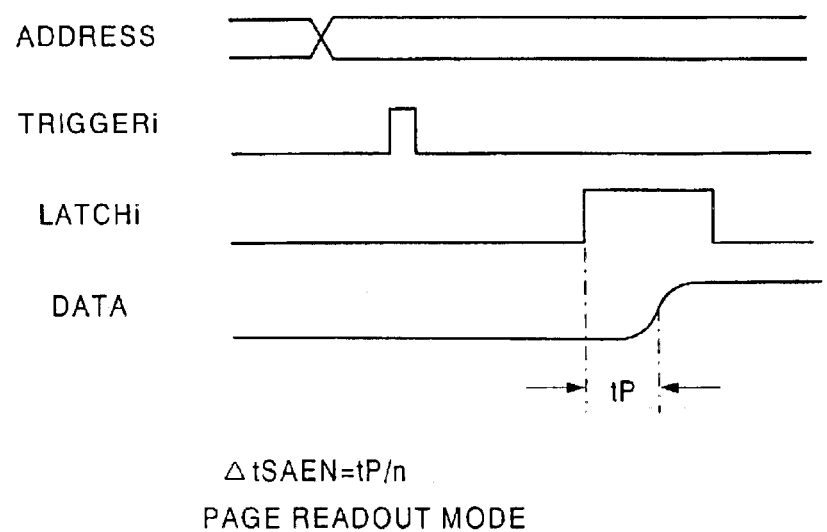
FIG. 10 is a diagram showing operation waveforms in a semiconductor memory device in a page readout mode according to a third embodiment.
Figure 11:
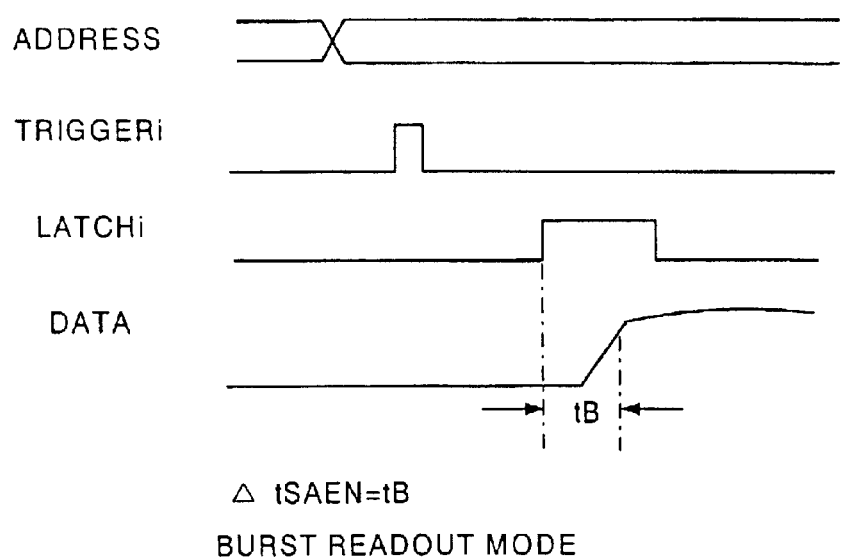
FIG. 11 is a diagram showing operation waveforms in the semiconductor memory device in a burst readout mode according to the third embodiment.

FIG. 10 is a diagram showing operation waveforms of the address signal ADDRESS, the trigger pulse signal TRIGGER1, the data latch pulse signal LATCHi and a data readout signal DATA in the page readout mode of the above mentioned embodiments. FIG. 11 is a diagram showing operation waveforms of these signals in the burst readout mode of the above-mentioned embodiments. The page readout mode or the burst readout mode is selected by setting from an outside.

As shown in FIG. 10, in the page readout mode, the shift time ΔtSAEN among the sense amplifier enable signal SAENi is set at a value that is a time tP divided by the number of pages n, where the time tP is a period from the end of the latch operation of the first page to the actual output thereof. That is, the shift time ΔtSAEN=tP/n.

This is because it has not been determined which page should be accessed after data of the first access is outputted, and therefore it is necessary to have read data of the other pages until the data of the first page is outputted.

On the other hand, in the burst readout mode, as shown in FIG. 11, the shift time ΔtSAEN of the sense amplifier enable signal SAENi may be a time tB that is a period from the end of the latch operation of the first page to the actual output thereof. That is, the shift time ΔtSAEN=tB.

This is because it has been determined which page should be access after data of the first access is outputted, and therefore only having read data of the next page is sufficient until the data of the first page is outputted.

Here, the time tP is different from the time tB because an output speed of the page readout mode is not necessarily equal to an output speed of the burst readout mode. Usually, the time tB in the burst readout mode is shorter.

As a result, the time tB/n<the time tP/n, so that the shift time ΔtSAEN of the burst readout mode becomes too short. In order to avoid this problem, for example, an internal clock frequency is changeable and then the shift time ΔtSAEN may be set at the time tB in the burst readout mode. As a result, the noise and the voltage drop can be further suppressed in the burst readout mode.

The present invention is not limited to the embodiments mentioned above, but various modifications can be applied. For example, the sense amplifier enable signals SAENi are enabled at different timing from each other and then the sense amplifier enable signals SAENi are disabled at different timing from each other in the embodiments mentioned above. However, the sense amplifier enable signal SAENi for a part of the groups may be simultaneously enabled and simultaneously disabled. In other words, the sense amplifier enable signal SAENi for a part of the groups may be enabled at different timing and disabled at different timing from other groups.

What is claimed is:

1. A semiconductor memory device, comprising:

a plurality of sense amplifiers divided into a plurality of groups, each of the groups being a unit of a page readout operation;

a sense amplifier control signal generation circuit which outputs a sense amplifier control signal for enabling the sense amplifiers of each group and disabling the sense amplifiers of each group, wherein the sense amplifier control signal enables and disables the sense amplifiers of a part of the groups at different timing from the sense amplifiers of other group's; and a plurality of memory cells connected to the sense amplifiers via data lines, wherein the sense amplifier control signal generation circuit outputs the sense amplifier control signal so as to enable the sense amplifiers of each group at different timing and disable the sense amplifiers of each group at different timing, wherein a period from enabling the sense amplifiers to disabling them in accordance with the sense amplifier control signal is a time necessary for precharging the data lines connected to the memory cells, determining data read out from the memory cells via the data lines, and latching the data, wherein the sense amplifier control signal generation circuit comprises sense amplifier enable signal generation circuits for every group, and each of the sense amplifier enable signal generation circuits outputs the sense amplifier control signal, wherein each of the sense amplifier enable signal generation circuits comprises:
- a first generation circuit which generates a data line precharge signal for precharging the data lines in accordance with an inputted trigger signal;
- a second generation circuit which generates a sense signal for reading out data from the memory cells via the data lines and determining the data in accordance with the data line precharge signal;
- a third generation circuit which generates a data latch signal for latching the determined data in accordance with the sense signal; and
- a fourth generation circuit which generates the sense amplifier control signal of an enable state while the data line precharge signal, the sense signal and the data latch signal are outputted.

2. The semiconductor memory device as set forth in claim 1, wherein the sense amplifier control signal generation circuit further comprises:
- an address decode circuit which decodes the inputted address signal and outputs a first group selection signal for firstly enabling the sense amplifier of the group which corresponds to the decoded address signal;
- an increment circuit which outputs the trigger signal into the sense amplifier enable signal generation circuit of the group which corresponds to the decoded address signal in accordance with the first group selection signal and sequentially outputs the trigger signal into the sense amplifier enable signal generation circuit of the other groups.

3. The semiconductor memory device as set forth in claim 2, wherein the increment circuit sequentially outputs the trigger signal by an increment operation which synchronizes with a first clock signal generated inside the semiconductor memory device.

4. The semiconductor memory device as set forth in claim 3, wherein the increment circuit sequentially outputs the trigger signal in a cycle of a half period of the first clock signal, by an increment operation which synchronizes with the first clock signal and a second clock signal which is shifted a half period with respect to the first clock signal.

5. The semiconductor memory device as set forth in claim 4, wherein a clock frequency of the first clock signal is changed in accordance with a readout mode which is selected by an input signal from the outside of the semiconductor memory device.

6. A semiconductor memory device, comprising:
- a plurality of sense amplifiers divided into a plurality of groups, each of the groups being a unit of a page readout operation;
- a sense amplifier control signal generation circuit which outputs a sense amplifier control signal for enabling the sense amplifiers of each group and disabling the sense amplifiers of each group, wherein the sense amplifier control signal enables and disables the sense amplifiers of a part of the groups at different timing from the sense amplifiers of other groups; and
- a plurality of memory cells connected to the sense amplifiers via data lines, wherein the sense amplifier control signal generation circuit outputs the sense amplifier control signal so as to enable the sense amplifiers of each group at different timing and disable the sense amplifiers of each group at different timing, and a period from enabling the sense amplifiers to disabling them in accordance with the sense amplifier control signal is a time necessary for precharging the data lines connected to the memory cells, determining data read out from the memory cells via the data lines, and latching the data.

7. The semiconductor memory device as set forth in claim 6, wherein the sense amplifier control signal generation circuit enables the sense amplifiers of the group which corresponds to an inputted address signal and then sequentially enables the sense amplifiers of the other groups.

8. The semiconductor memory device as set forth in claim 6, wherein the sense amplifier control signal generation circuit comprises sense amplifier enable signal generation circuits for every group, and each of the sense amplifier enable signal generation circuits outputs the sense amplifier control signal.

* * * * *